Feb. 7, 1967 P. WHITE 3,303,357

POLYMERIC FILM FIELD-SENSITIVE DEVICES

Filed Jan. 24, 1964

3 Sheets-Sheet 1

INVENTOR.
PETER WHITE

BY S. P. Tedesco

ATTORNEY

United States Patent Office 3,303,357
Patented Feb. 7, 1967

3,303,357

POLYMERIC FILM FIELD-SENSITIVE DEVICES

Peter White, Harlow, Essex, England, assignor to International Business Machines Corporation, New York, N.Y., a corporation of New York Filed Jan. 24, 1964, Ser. No. 340,067
10 Claims. (Cl. 307—88.5)

This invention relates to electrical circuit components wherein the field-sensitive conduction characteristics of thin polymeric films are utilized.

In recent years, the electronics industry has become increasingly more interested in the possibility of fabricating integrated microminiature circuit arrangements wherein all "components," both active and passive, are fabricated concurrently. It has been recognized that microminiaturization of circuit components is best achieved by processes involving the superdeposition of thin film patterns of selected materials. In these fabrication processes, thin films of polymeric materials will undoubtedly find wide and useful application for insulating and, also, encapsulating purposes. Thin polymeric films are suitable for these applications since they are stable when exposed to the atmosphere, exhibit a sufficiently high dielectric constant, and are sufficiently durable to withstand substantial physical and thermal shocks. In accordance with present techniques, thin polymeric films can be formed in predetermined patterns either by photolytic techniques or by electron beam techniques. For example, a photolytic process for forming selected patterns of thin polymeric films in vacuum and, also, in an inert atmosphere has been described in U.S. patent application Serial No. 205,821, now Patent No. 3,271,180 filed on June 19, 1962, on behalf of P. White. In the described process, molecules of monomeric material adsorbed on a substrate surface are elevated to an excited state by adsorption of a particular wavelength of radiation in the ultraviolet region; the excited molecules react by a process of vinyl addition polymerization to form a continuous film which adheres strongly to the substrate surface. Also, a process for forming thin polymeric films by electron beam techniques has been described, for example, in "Polymerization of Butadiene Gas on Surfaces Under Low Energy Electron Bombardment," by I. Haller and P. White, Journal of Physical Chemistry, vol. 67, 1963, page 1784 and in "Formation of Thin Polymer Films by Electron Bombardment," by R. W. Christy, Journal of Applied Physics, vol. 31, No. 9, September 1960. In electron beam polymerization techniques, molecules of the monomeric material are elevated to an excited state so as to polymerize, generally by a bond-rupturing or "fracturing," mechanism due to the excessive energies of the electron beam.

It is an object of this invention to provide a novel thin film circuit component formed, in part, of thin polymeric films and which is adapted for batch fabrication by conventional fabrication techniques.

It is another object of this invention to provide microminiature circuit elements which utilize the field-sensitive conduction characteristics of thin polymeric films.

It is another object of this invention to provide a field-sensitive circuit component exhibiting nonlinear current-voltage characteristics.

These and other objects and features of this invention are achieved in accordance with one aspect of this invention by depositing a first thin polymeric film in laminar fashion between first and second metallic electrodes to form a two-terminal circuit component, the thickness of such film being sufficient to preclude appreciable electron "tunneling" between the metallic electrodes. Within a low range of applied voltages, the polymeric film presents a high total potential barrier to conduction electrons between the metallic electrodes so as to be essentially insulative, or open-circuited. This total potential barrier includes both intramolecular potential barriers, i.e., the mobility of conduction electrons along the individual molecules, and also intermolecular potential barriers, i.e., the mobility of conduction electrons between contiguous molecules, the latter effectively limiting electron conduction through the thin polymeric film. As the voltage across the metallic electrodes is increased and electrical fields of at least a critical magnitude, for example, $5 \times 10^5$ volts/cm. are applied across the thin polymeric film, conduction of electrons through such film increases exponentially. The electrical fields applied across the polymeric film, in effect, modulate the intermolecular potential barriers to a level whereat the conduction electrons have sufficient energy to "tunnel" through the individual barriers and pass between the metallic electrodes. The resultant current-voltage characteristics of the two terminal circuit component are sufficiently nonlinear so as to substantially duplicate those of a semiconductor or gas-filled diode and, therefore, find particular application as switching elements.

In accordance with another aspect of this invention, a three-terminal circuit component is achieved by the provision of a third metallic electrode in field-applying relationship with the first thin polymeric film intermediate the first and second electrodes. When biasing voltages are applied to the third metallic, or gate, electrode, the resulting electrical fields are effective to modulate the energy potential barriers in the first thin polymeric film intermediate the first and second metallic, or source and drain, electrodes. Accordingly, and due to the superimposed electrical fields, the nonlinear current-voltage characteristics of the source-drain structure are displaced along the voltage axis, such displacement being a function of the magnitude of the applied field. In other words, for a fixed source-to-drain voltage $V_{sd}$, the source-to-drain current $I_{sd}$ is modulated by biasing voltages $V_b$ applied to the gate electrode.

In recent years, numerous mechanisms or models, have been proposed to describe electron conduction through normally-insulating materials. For example, in "The Elecrical Conductivity of Solid Free Radicals and the Tunneling Mechanism," by D. D. Eley and M. R. Willis, Symposium on Electrical Conductivity in Organic Solids, pages 257 through 276, April 20–22, 1961, it has been reported that electron conduction through bulk specimens of stable organic free radicals, i.e., several orders of magnitude greater than 10,000 A., exhibits only a gradual departure from Ohm's law. Also, numerous conduction mechanisms have been postulated as supporting conduction through this insulating films. For example, quantum-mechanical tunneling has been discussed in "Tunneling Through Thin Insulating Layers," by J. C. Fisher and I. Giaever, Journal of Applied Physics, vol. 32, No. 2, February 1961. Schottky emission has been discussed, for example, in "Schottky Emission Through Thin Insulating Films," by P. R. Emtage and W. Tantraporn in Physical Review Letters, vol. 8, No. 7, April 1, 1962. Also, field-emission has been discussed in "Space-Charge-Limited Tunnel Emission Into an Insulating Film," by D. V. Geppert, Journal of Applied Physics, vol. 33, No. 10, October 1962, and, also, in "Operation of Tunnel-Emission Devices," by C. A. Mead, Journal of Applied Physics, vol. 32, No. 4, April 1961. The mechanism which supports conduction in the structure of the present invention is distinguishable from any of the above-proposed thin film mechanisms in that conduction electrons have insufficient energy to overcome the total potential barrier of the polymeric film so as to pass between the metallic electrodes. Conduction through the polymeric film is achieved by field-modulation of the intermolecular potential barriers, such model being consistent with that of Eley, supra; accordingly, the circuit components in accordance with this invention are properly considered field-effect devices. The nonlinear characteristics of the novel circuit components of this invention, which exhibit a marked departure from Ohm's law, are obtained since electrical fields of sufficient magnitude to modulate the intermolecular barriers in the thin polymeric films are generated from applied voltages insufficient to cause corona discharge or breakdown due to the thinness of such films, i.e., 50 A. to 800 A. The polymeric films can be formed by known techniques, e.g., photolysis, charged particle bombardment, catalytic methods, etc. Such polymeric films should be pin-hole free and preferably free of structural defects, e.g., holes, etc., so as to avoid inhomogeneous electrical fields.

The foregoing and other objects, features, and advantages of the invention will be apparent from the following more particular description of preferred embodiments of the invention, as illustrated in the accompanying drawings.

In the drawings:

FIG. 1*a* is a cross-sectional view of a two-terminal electrical circuit device in accordance with this invention.

FIG. 2*a* is a cross-sectional view of a three-terminal electrical circuit device in accordance with this invention.

FIGS. 1*b* and 2*b* depict the current voltage characteristics of the electrical circuit devices shown in FIGS. 1*a* and 2*a*, respectively.

FIGS. 1*c* and 2*c* illustrate steps in the fabrication process of the electrical circuit devices of FIGS. 1*a* and 2*a*, respectively.

Figure 6:
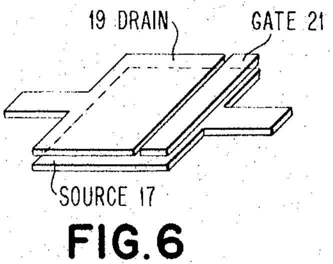
Figure 7:
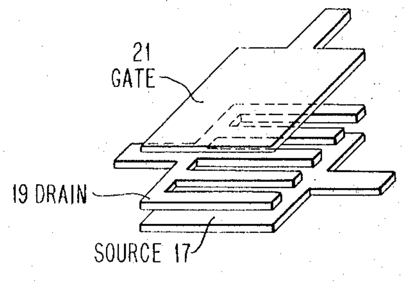
Figure 8:
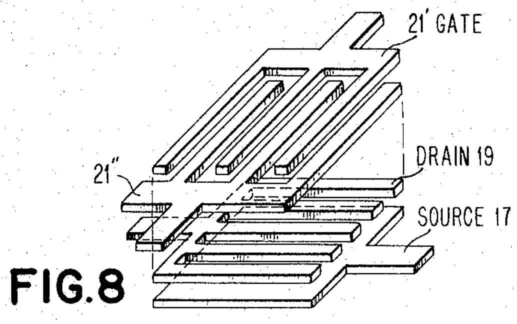

FIGS. 6, 7, and 8 are exploded views of additional embodiments of three-terminal electrical devices in accordance with this invention.

Figure 1A:
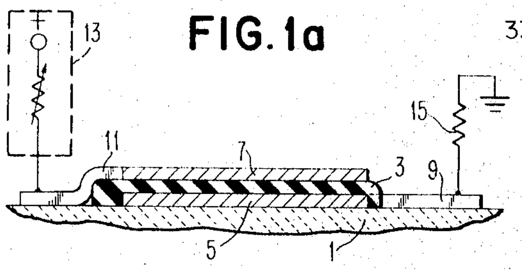

Referring to FIG. 1*a*, the two-terminal, or diode, device is formed in laminar fashion on a substrate 1 and comprises a thin polymer film 3 positioned between a first thin metallic electrode 5 and a second thin metallic electrode 7. The body portions of electrodes 5 and 7 are registered and are connected at lands 9 and 11, respectively, to a variable voltage source 13 and along load resistor 15 to ground, respectively. When voltage is applied to land 11, polymeric film 3 is subjected to electrical fields E, given by $V/d$ where V is the applied voltage and $d$ is film thickness. When the applied voltage V is in excess of a critical magnitude $V_c$, electrical fields E are of sufficient magnitude to overcome the normal insulating characteristics of polymeric film 3 and induce conduction between electrodes 5 and 7. As thickness $d$ of polymeric film 3 is small, i.e., less than 1000 A., voltage V is insufficient to generate corona discharge between electrodes 5 and 7. As shown in FIG. 1*b*, as voltage V applied across electrodes 5 and 7 is increased, the current-voltage characteristics exhibit a high resistance, linear region over a low voltage range continuous with a high voltage region commencing at a critical voltage $V_c$ wherein conduction between electrodes 5 and 7 increase exponentially. As hereinafter described with respect to FIG. 1*b*, the critical voltage $V_c$ is dependent on the thickness $d$ of polymeric film 3.

Figure 2A:
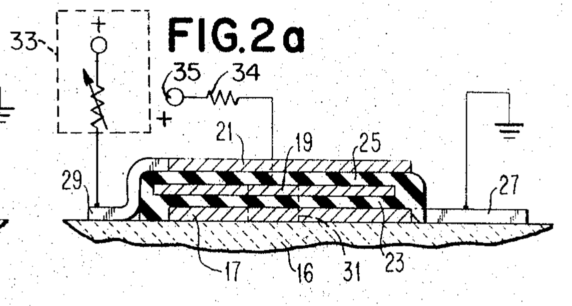

The three terminal, or triode, device of FIG. 2*a* is also formed in laminar fashion on a substrate 16 and comprises thin metallic electrodes 17, 19, and 21 and thin polymeric films 23 and 25. The thin metallic electrodes 17, 19 and 21, hereinafter referred to as source, drain, and gate electrodes, respectively, are formed of square body portions having lands 27, 31, and 29, respectively. Body portions of source electrode 17 and gate electrode 21 are registered; drain electrode 19 is displaced slightly so that portions of the opposing surfaces of drain and gate electrodes 17 and 21 are separated only by polymeric films 23 and 25. As illustrated, source electrode 17 is connected to ground at land 27; drain electrode 19 is connected to voltage source 35 along load resistor 34 at land 21, and gate electrode 21 is connected to a variable voltage source 33 of biasing voltage $V_b$ at land 29 (see FIG. 2*c*). As hereinafter described, conduction between source electrode 17 and drain electrode 19 is modulated by electrical fields applied to polymeric film 23 when biasing voltages $V_b$ are applied to gate electrode 21. As illustrated in FIG. 2*b*, the nonlinear characteristics of the source 17—drain 19—polymeric film 23 structure are displaced along the voltage axis when biasing voltages $V_b$ applied to gate electrode 21 are varied, as hereinafter described with respect to FIG. 2*b*.

Figure 3:
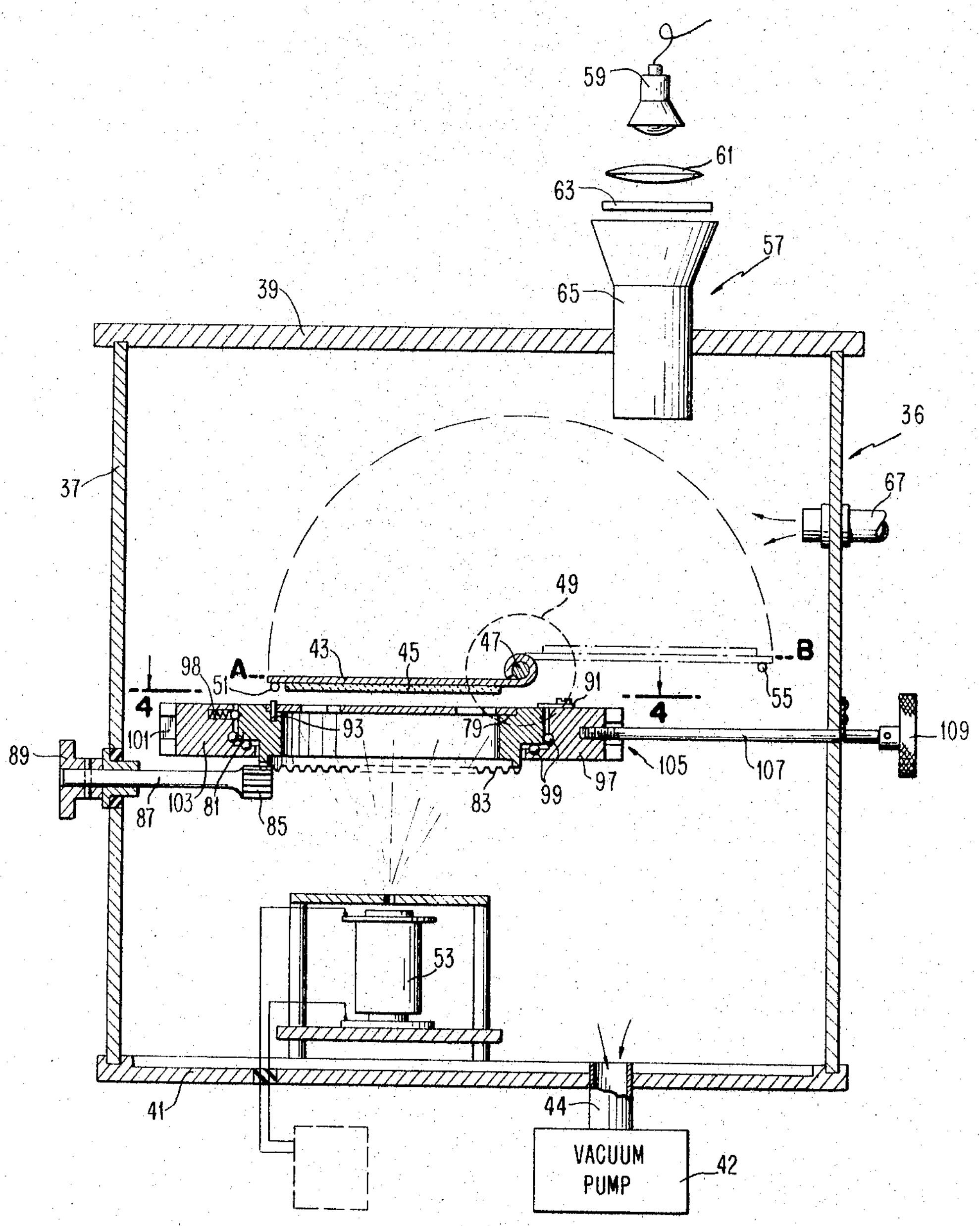
FIG. 3 is a cross-sectional view of a vacuum system useful in fabricating the electrical circuit devices of FIGS. 1*a* and 2*a*.
Figure 4:
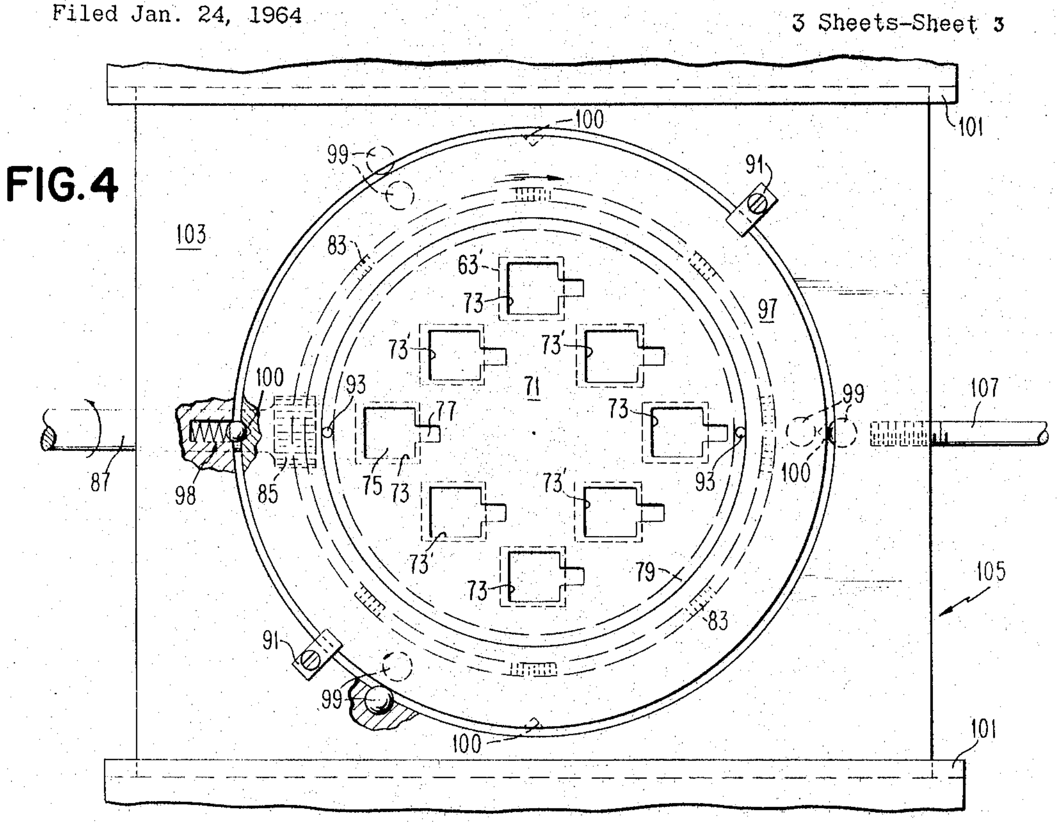
FIG. 4 is a top view of the masking arrangement useful in the vacuum system of FIG. 3 for fabricating the electrical circuit devices of FIGS. 1*a* and 2*a*.

The structures illustrated in FIGS. 1*a* and 2*a*, respectively, can be formed by known processes, a system for effecting one such process has been illustrated in FIGS. 3 and 4. Such system includes a vacuum housing 36 comprising a cylindrical member 37 and upper and lower plate members 39 and 41. A vacuum pump 42 of conventional design communicates with the interior of chamber 36 along an exhaust port 44 through plate member 41.

A substrate holder 43 is positioned along the upper portion of housing 35 and supports substrate 45, i.e., substrates 1 and 16 of FIGS 1*a* and 2*a*. Substrate holder 43 is mounted for pivotal rotation on journal 47 which extends through the far wall of cylindrical member 37 and is connected to control knob 49. Substrate holder 43, when supported in position A by a stop-rod 51, is disposed immediately above evaporation source 53. Evaporation source 53 can be of conventional design as described, for example, in the above-identified P. White patent application and contains a metallic evaporant to be deposited onto substrate 45. Substrate holder 43 is rotatable in a clockwise direction by control knob 49 to position B (shown in dashed outline). While in position B, substrate 45 is supported on a second stop-rod 55 beneath an optical system 57. Optical system 57, which includes light source 59 of ultraviolet light of selected frequencies, collimating lens 61, and optical mask 63, illuminates substrate 45 in predetermined optical patterns. Optical patterns defined by mask 63 are directed along a quartz light pipe 65 which extends into vacuum housing 36 through the plate member 39, and are effective to support photolytic polymerization of monomeric material adsorbed on selected areas of substrate 45, as hereinafter described.

Monomeric material to be polymerized in selected patterns on substrate 45 is introduced along port 67 in cylindrical member 37 and distributes itself within a vacuum housing 36 between the vapor phase and absorbed layers on the internal surfaces, e.g., substrate 45. When illuminated by optical system 57, the molecules of the monomeric material become reactive and polymerize by a process of vinyl addition to form a continuous film only over the illuminated surfaces of substrate 45. Monomeric material not illuminated by optical system 57 remains in an unreacted monomeric form and, as hereinafter described, can be exhausted subsequently along port 44 by the vacuum pump system 42.

In addition, a pattern mask 71 is interposed between the evaporation source 53 and substrate 45 while supported in position A. In the described process, a single pattern mask 71 is employed to define the geometries of each of the metallic films comprising the circuit devices of FIGS. 1*a* and 1*b*, respectively. For example, referring to FIGS. 3 and 4, pattern mask 71 is of circular geometry, and includes a plurality of pattern-defining apertures each defining a square body portion 75 and a continuous finger extension 77. Corresponding pattern-defining apertures 73 and 73' etc., are in fixed spatial relationship whereby rotation of pattern mask 71 in 90° arcs effectively substitutes body portions 75 of corresponding apertures 73, 73' etc., over a same surface area of substrate 45 while orienting corresponding finger extensions 77 in different directions. Pattern mask 71 is supported on shoulders 79 defined in a mask mount 81, the perimeter of which defines a ring gear 83 engaged by a bevel gear 85 mounted on a splined shaft 87. The splined shaft 87 extends to a control knob 89 disposed exterior to cylindrical member 37. In addition, pattern mask 71 is fixedly located in mask mount 81 by tabs 91 and also engaging pins 93 which extend through locating holes in mask 71. Mask mount 81 is rotatable within a carriage member 97, for example, by means of ball bearings 99. Rotation of mask mount 81, and pattern mask 71, in 90° arcs within carriage member 97 is controlled by spring-pressed detent mechanism 98 and spaced notches 100. Carriage member 97 is slideably received in ways 101 defined in a support structure 103 mounted on the inner wall of cylindrical member 37. A vernier screw 105 engages the mask mount 81 and is integral along shaft 107 to a control knob 109 disposed exterior to vacuum housing 35. Vernier screw 105 accurately controls horizontal displacement of mask mount 81, and the pattern mask 71, which respect to the substrate 45 while in position A.

Figure 1C:
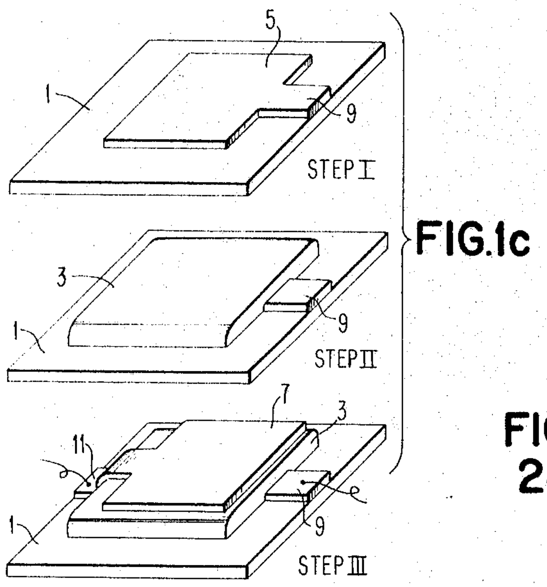
Figure 2C:
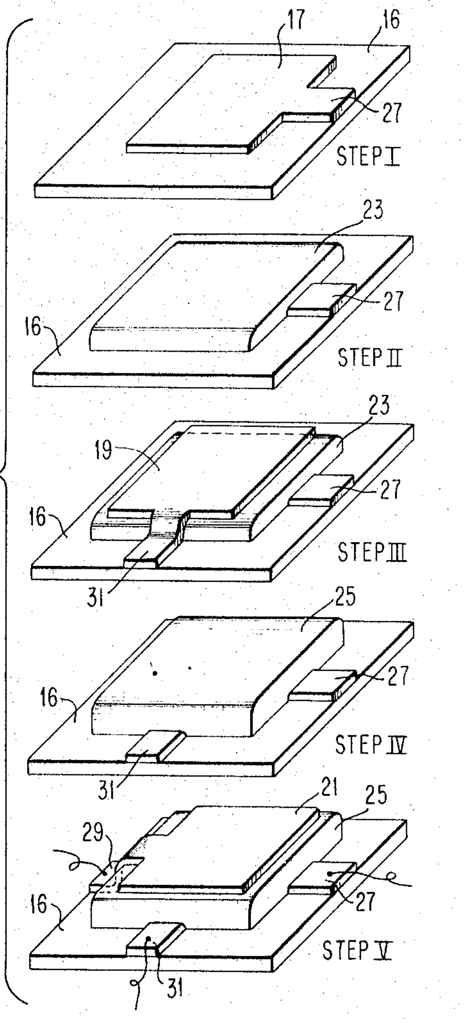
Figures 1B, 2B:
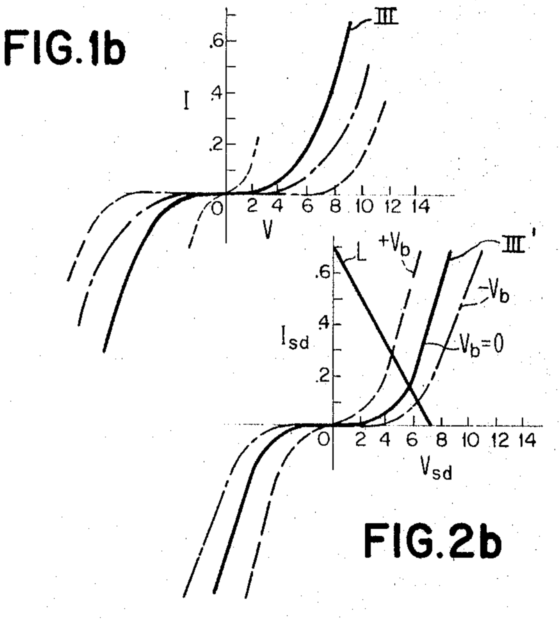

The steps in the fabrication processes of the circuit devices of FIGS. 1*a* and 2*a* are illustrated in FIGS. 1*c* and 2*c*, respectively. Initially, housing 36 is evacuated by pump system 42 to a sufficiently low pressure to effect vacuum metalizing techniques, e.g., $10^{-6}$ torr; substrate holder 43 along with substrate 45 has been rotated to position A. During step I of FIGS. 1*c* and 2*c*, which are identical, source 53 is operated to volatilize the evaporant, e.g., lead, copper, gold, or any suitable conductive material, which passes upwardly through the pattern mask 71 to deposit onto substrate 45. The pattern of evaporant material deposited onto substrate 45 through pattern mask 71 is illustrated in each of FIGS. 1*c* and 2*c* and corresponds to metallic electrodes 5 and 17 of FIGS. 1*a* and 2*a*, respectively. The thicknesses of metallic electrodes 5 and 17 are at least sufficient to insure electrical continuity, e.g., 500 A. to 1000 A.

Also, steps II of FIGS. 1*c* and 2*c* to form polymeric films 3 and 23 are identical. When metallic electrodes 5 and 17 have been deposited, source 53 is de-energized and substrate holder 43 is rotated to position B and disposed beneath optical system 57. An ethylenically unsaturated monomer susceptible to photolytic polymerization in the form of a vapor is introduced along port 67.

The ethylenically unsaturated monomer may comprise any of the known photolytically polymerizable organic vinyl compounds, i.e., compounds containing a single $CH_2{=}C<$ group as the sole site of addition polymerization. Typically suitable monomers include acrylyl and alkacrylyl compounds, e.g., acrylic, haloacrylic, and methacrylic acids, esters, nitrides and anides such as acrylonitride, methyl methacrylate, ethyl methacrylate, butyl methacrylate, actyl methacrylate, cyclohexyl methacrylate, methoxymethyl methacrylate, chloroethyl methacrylate, methacrylic acid, ethyl acrylate, calcium acrylate, and alphachloroacrylic acid; vinyl and vinylidene halides such as vinyl chloride, vinyl fluoride, vinylidene fluoride; vinyl carboxylates such as vinyl acetate, vinyl laurate, vinyl propionate, vinyl stearate; N-vinyl imedes such as N-vinyl phthalimide and N-vinyl caprolactam; vinyl acyls such as styrene and other vinyle derivatives including vinyl pyrolidone. Mixtures of any or more of the above monomers may also be utilized.

Other suitable ethylenically unsaturated monomers are:

| | |
|---|---|
| acrolein | acrylamide |
| acrylic anhydride | acrylyl chloride |
| allyl acetate | allyl acetone |
| allyl acrylate | allyl alcohol |
| allylamine | allyl anthranilate |
| allylbenzene | allyl benzoate |
| allyl chloride | allyl cinnamate |
| allyl glycidyl ether | allyl phenyl acetate |
| benzyl acrylate | benzyl methacrylate |
| butadiene monoxide | n-butyl acrylate |
| sec-butyl acrylate | iso-butyl acrylate |
| tert-buty acrylate | n-butyl methacrylate |
| 2-chloro-1,3-butadiene | 2-chlorostyrene |
| cinnamyl acrylate | cinnamyl methacrylate |
| divinyl benzene | divinyl sulfide |
| glyceryl triacrylate | glycidyl acrylate |
| isoprene | isopropenyl acetylene |
| isopropylstyrene | methacrolein |
| methacrylamide | methacrylonitrile |
| methyl acrylate | methyl styrene |
| methyl vinyl ketone | nitroethylene |
| nitrostyrene | pentadiene |
| phenyl acrylate | triallylamine |
| vinyl acetic acid | vinyl acrylate |
| vinyl benzoate | vinyl crotonate |
| vinylidene chloride | vinyl methacrylate |
| vinyl naphthalene | vinyl phenylacetate |

The monomeric vapor distributes itself within vacuum housing 35 and forms an adsorbed layer, at least, on the surface of substrate 45 and over the previously-deposited metallic electrode. The adsorbed monomeric layer is illuminated by optical system 57 in predetermined light patterns defined by optical mask 63. Pattern-defining apertures in optical mask 63 have a rectangular geometry whereby the same surface areas of substrate 45 are illuminated by optical system 57 as are exposed when pattern mask 71 is displaced horizontally with respect to substrate 45, as hereinafter described with respect to step III of FIG. 2*c*. For example, referring to FIG. 4, if optical mask 63 is superimposed on pattern mask 71, the pattern-defining apertures provided therein are as illustrated by the dashed lines 63'. When illuminated, molecules of adsorbed monomeric vapor are elevated to an excited state by adsorption of a particular wave-length of light in the ultraviolet region and react by a vinyl-addition process to form continuous polymeric films 3 and 23 of FIGS. 1*a* and 2*a*, respectively. Vinyl addition polymerization process as described provides structural specificity and, also, film continuity. The thickness of the resulting polymeric films is dependent upon (1) the partial pressures of the monomeric vapor introduced into the vacuum housing 36 and (2) the intensity and duration of illumination of substrate 45. When a polymeric film of desired thickness has been formed, as hereinafter described, both illumination of substrate 45 and introduction of the monomeric vapor into housing 36 are discontinued; unreacted monomeric material and also byproducts of the photolytic process are exhausted by pump system 42 along exhaust port 44.

Pressure within the vacuum chamber 36 is again reduced to $10^{-6}$ torr by pump system 42, and substrate holder 43 is rotated to position A to effect step III. Also, mask 71 is rotated in a clockwise direction through a 90° arc by knob 89 and locked by detent mechanism 98. Accordingly, identical areas of the substrate 45 are exposed to source 53 through body portion 75 of corresponding apertures 73, 73', etc.; however, finger extensions 77 have been rotated through a 90° arc.

Step III of FIG. 1*c* differs from that of FIG. 2*c*, as hereinafter described, in that pattern mask 71 is not displaced horizontally with respect to substrate 45. With respect to step III of FIG. 1*c*, evaporation source 53 is energized upon rotation of pattern mask 71 so as to deposit second metallic electrode 7 over polymeric film 3 of step II and in registration with the metallic electrode 5 of step I. Rotation of pattern mask 71 provides only that lands 9 and 11 are not superimposed so as to facilitate electrical connections, for example, as shown in FIG. 1*a*. The fabrication of the two-terminal device of FIG. 1*a* is now completed.

In step III of the process of FIG. 2*c*, however, knob 89 is rotated to displace pattern mask 71 horizontally with respect to substrate 45. Displacement of pattern mask 71 at this time provides that metallic electrode 19 to be formed is not registered with metallic electrode 17 of step I and metallic electrode 21 of step V, hereinafter described, whereby a portion of opposing surfaces of the latter electrodes are separated only by polymeric material. Evaporation source 53 is again energized to form metallic electrode 19 over polymeric film 23. Subsequently, and in accordance with step IV of FIG. 1*c*, a second polymeric film 23 is deposited identically as described in step II. To effect step IV, substrate holder 43 is rotated to position B and monomeric vapor introduced into housing 35 to be photolytically polymerized by optical system 57. When polymeric film 23 has been formed, step V of the process is effected wherein mask holder 43 is again rotated to position A and the carriage member 97 is returned to its original position of step I by vernier screw 105. The substrate holder 43 is now rotated through an additional 90° arc, i.e., 180° from its position during step I. Accordingly, when evaporation source 53 is operated, the metallic electrode 21 is deposited over the second polymeric film in registered relationship with the first metallic electrode 17 while land 31 is registered with neither finger extensions 27 nor 29 to facilitate electrical connections. Deposition of metallic electrode 21 over polymeric film 25 completes the structure of FIG. 2*a*.

The current-voltage characteristics of the two-terminal device of FIG. 1*a* are strikingly similar to those of semiconductor and gas-filled diode devices. As the voltage applied to metallic electrode 7 is increased from zero volts, polymeric film 3 initially presents a very high resistance, or open-circuited, condition; conduction current increases linearly at a very slow rate along the low voltage portion of the characteristic curve; conduction through polymeric film 3 and between the metallic electrodes 5 and 7 increases substantially exponentially and tends to become linear as the applied voltage is increased beyond a critical voltage $V_c$. The magnitude of this critical voltage $V_c$ is markedly dependent upon the thickness of polymeric film 3. Thus, for example, when the polymeric films are formed of butadiene, critical voltage $V_c$ can range from approximately ½ volt for film thicknesses of 50 A. to approximately 7½ volts for film thicknesses of 800 A. as indicated by curves I and II of FIG. 1*b*.

Figure 5:
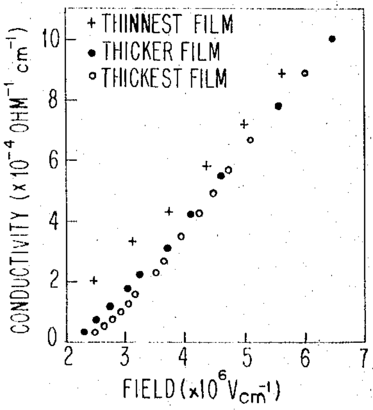
FIG. 5 is a plot of conductivity versus applied electrical field E for polymeric films of varying thicknesses.

The current-voltage characteristics of circuit devices of FIG. 1*a* wherein thinner polymer films, e.g., 30 A. to 50 A. are employed are generally similar to those which would normally be expected if quantum-mechanical tunneling were the conduction mechanism. However, accepted theory precludes quantum-mechanical tunneling through insultaing, i.e., polymeric, films having thicknesses in excess of, say, 50 A. Conduction through polymeric films, regardless of thickness, must be explained in terms of a single mechanism since the activation energy for conduction in the linear, or low voltage region, is the same as that in the exponential or high voltage region. Again, since the shape, or nonlinearity, of current-voltage characteristics seem to be independent of film thickness, it is reasonable to suppose that a same mechanism supports conduction in each of the polymeric films, i.e., 50 A. to 800 A. In other words, the same types of carriers and the same properties in the polymeric films govern conduction along both linear and exponential regions of the characteristic curve. In FIG. 5, conductivity is plotted as a function of the electric field E applied to polymeric films of varying thicknesses. Conductivity of the polymeric films of varying thicknesses falls within a narrow and substantially linear range indicating an essential dependence of conduction current through the polymeric films, regardless of thickness.

The conduction mechanism of the structure of FIG. 1*a*, appears to be due to a field-effect mechanism and distinct from quantum-mechanical tunneling, from Schottky emission, and from field-emission mechanism. Conduction between the metallic electrodes 5 and 7 and through the polymeric film 3 can be explained in terms of the mechanism postulated by Eley, supra, regarding conduction through bulk specimens of stable, solid organic free radicals. By such mechanism, conduction in organic polymeric materials takes place by a hopping mechanism whereby conduction electrons pass along contiguous molecules, jumping from one molecule to another over a potential energy barrier; such conduction is limited by electron mobility along the individual molecules, i.e., intramolecular potential barriers, and by the intermolecular potential barriers. As the mobility of conduction electrons along the polymeric molecule is relatively high, conduction through the polymeric material is limited primarily by intermolecular potential barriers. Since the transparency, which is dependent on the height and the width, of the intermolecular potential barriers to conduction electrons is field dependent, conduction through polymeric film 3 of FIG. 1*a* is a function of the voltage applied between metallic electrodes 5 and 7. As the voltage applied across metallic electrodes 5 and 7 is increased, the transparency of intermolecular potential barriers is increased to a level whereat quantum-mechanical tunneling by conduction electrons occurs and an exponential dependence of current upon applied field is obtained. Conduction through thin polymeric film 3, therefore, is determined by the electron mobility along each of the contiguous molecules, the transparency of the intermolecular energy barriers, and the magnitude of electrical fields E applied across the polymeric film. The transparency of the intermolecular potential barriers to conduction electrons is the limiting factor. However, electrical fields E of sufficient magnitude can be obtained within practical limits of applied voltage for example to avoid corona effects only when polymeric film 3 is less than about 1000 A.

Conduction electrons, for example, can be present in polymeric film 3 and also can be supplied through the metal-polymer interface defined by the more-negatively biased metallic electrode. The electrons supplied through the metal-polymer interface should possess low thermal energy so as to be ineffective, in the absence of applied electrical fields E, to overcome the intermolecular and intramolecular potential barriers in the polymeric film. Accordingly, the metal-polymer interface through which conduction electrons are supplied should exhibit a minimal work function so as not to inject "hot" electrons into the polymeric film. Such "hot" electrons would posses sufficient energy such that modulation of the intermolecular potential barriers would be ineffective to control conduction. A low surface barrier is achieved by insuring a very clean metal-polymer interface.

The triode structure of FIG. 2*a* can be considered as composed of two nonlinear devices, one such device comprising the source and drain electrodes 17 and 19 separated by polymeric film 23 and the other such device comprising the opposing surface areas of source and gate electrodes 17 and 21 separated by polymeric films 23 and 25. In FIG. 2*b*, composite characteristics are illustrated wherein source-drain current $I_{sd}$ is plotted as a function of the voltage $V_{sd}$ applied between the source and drain electrodes 17 and 19. In the absence of an applied biasing voltage $V_b$ at gate electrode 21, the current-voltage characteristics of the device of FIG. 2*a* are essentially defined by the source-drain structure (cf. curves III and III' of FIGS. 1*b* and 2*b*, respectively). When bias voltages $V_b$ are applied to gate electrode 21, the resulting electrical fields $E_s$ are superimposed on polymeric film 23 and between the source and drain electrodes 17 and 19. The effect of these superimposed electrical fields $E_s$ is to shift the current-voltage characteristics of the source drain structure horizontally along the voltage axis so as to be effectively rectifying more in one direction than in another. For example, when a positive biasing voltage $+V_b$ is applied to gate electrode 21, the current-voltage characteristics, as indicated by the dashed curve, are shifted to the left so that for a fixed source-drain voltage $V_{sd}$, increased source-to-drain current $I_{sd}$ is obtained. If an operating load line L is defined, the source-to-drain current $I_{sd}$ is effectively modulated by biasing voltages $V_b$ applied to gate electrode 21.

To minimize source-gate and, also, drain-gate currents during dynamic operation, polymeric film 25 intermediate drain and gate electrodes 19 and 21 is made sufficiently thick to prevent conduction, e.g., in excess of 1000 A. Also, a same effect is achieved if the polymeric material formed between the drain and gate electrodes is selected to exhibit higher resistivity, i.e., high intramolecular energy barriers. For example, polymeric film 23 can be formed of butadiene which exhibits $10^8$ ohms/cm. while polymeric film 25 can be formed of acrolein which exhibits $10^{14}$ ohms/cm. As in the case described with respect to the two-terminal circuit device of FIG. 1*a*, the work function of the interface defined by source electrode 17 is sufficiently low to prevent the entry of "hot" electrons into polymer film 23 whereby modulation of intermolecular potential barriers by the superimposed electric fields $E_s$ generated by biasing voltages $V_b$ are effective to control conduction between the source and drain electrodes 17 and 19. On the other hand, the interface defined by gate electrode 21 should be sufficiently high to prevent electron conduction from polymeric film 25 to gate electrode 21.

Alternative embodiments of circuit devices in accordance with this invention are illustrated in FIGS. 6, 7, and 8 wherein polymeric films 23 and 25 have been omitted for the purposes of clarification. The particular geometries of the pattern-defining apertures to be provided in pattern mask 71 are obvious from the showing; a same optical mask 63 as hereinabove described can be employed. In each of these embodiments, electrical fields $E_s$ generated biasing voltages $V_b$ applied to gate electrode 21 are applied to the polymeric film 23 between source electrode 17 and drain electrode 19. For example, as illustrated in FIG. 6, the dimensions of gate electrode 21 have been reduced to substantially correspond to the exposed area of source electrode 17, the gate electrode being deposited in the plane of drain electrode 19. Alternatively, as illustrated in FIG. 7, drain conductor 19 can be formed in "pitch fork" pattern such that fields generated by biasing voltages $V_b$ applied to gate electrode 21 pass between the pattern to modulate intermolecular potential barriers in the polymeric film 23. In addition, the structure of FIG. 7 can be modified as shown in FIG. 8 so as to define first and second gate electrodes 21' and 21'' formed in interlaced "pitch-fork" patterns transverse to the pattern of drain electrode 19. Biasing voltages $V_b$ applied to either or both of gate electrodes 21' and 21'', therefore, apply electrical fields to polymeric film 23 between source and drain electrodes 17 and 19. The structure of FIG. 8 is particularly adapted to perform logical functions, the particular function, i.e., AND or OR, being primarily determined by thickness and/or resistivity of polymeric film 23. When polymeric film 23 is sufficiently thin, voltage applied to either of gate electrodes 21' and 21'' is effective to displace the current-voltage characteristics of the source-drain structure sufficiently to draw appreciable source-drain current $I_{sd}$, such current being indicative of an OR logical function. On the other hand, for a thicker polymeric film 23, voltages need be applied to both gate conductors 21' and 21'' to draw a same appreciable source-drain current $I_{sd}$ so as to indicate an AND logical function.

While the invention has been particularly shown and described with reference to preferred embodiments thereof, it will be understood by those skilled in the art that various changes in form and details may be made therein without departing from the spirit and scope of the invention.

What is claimed is:

1. An electrical circuit component comprising first and second planar metallic electrodes, a thin polymeric film prepared from ethylenically unsaturated monomers formed over said first metallic electrode and sandwiched between said first and second electrodes, said thin polymeric film exhibiting a total potential energy barrier to preclude substantial electron conduction therethrough and between said first and said second electrodes in the absence of electrical fields in excess of a critical magnitude in response to which electron conduction increases substantially exponentially, first means for applying a first potential across said first and said second electrodes such as to subject said thin polymeric film to electrical fields of at least said critical magnitude, and a third planar metallic electrode formed over said thin polymeric film in the plane of said second electrode and insulated from said first and said second metallic electrodes and in electrical field-applying relationship with said thin polymeric film, second means for applying a varying potential across said first and said third electrodes, electrical fields generated by said second means being superimposed on said electrical fields of at least said critical magnitude so as to modulate electron conduction through said thin polymeric film and between said first and second electrodes.

2. An electrical circuit component as defined in claim 1 wherein said thin polymeric film is prepared from ethylenically unsaturated monomers by vinyl addition polymerization.

3. An electrical circuit component as defined in claim 1 wherein said thin polymeric film is prepared from monomeric butadiene.

4. An electrical circuit component as defined in claim 1 wherein said thin polymeric film is prepared from monomeric styrene.

5. An electrical circuit component as defined in claim 1 wherein said thin polymeric film is prepared from monomeric acrylic acid.

6. A logical circuit device comprising a first metallic electrode and a second metallic electrode, a first polymeric film prepared from an ethylenically unsaturated monomer and sandwiched between said first and said second electrodes to form a laminate structure, said first polymeric film having a thickness in excess of 50. A. and exhibiting a sufficiently high potential energy barrier to preclude substantial electron condition therethrough and between said first and second electrodes in the absence of an electrical field in excess of a critical magnitude in response to which electron conduction increases exponentially, means for applying a potential between said first and said second electrodes so as to apply a first electrical field across said first polymeric film, a second polymeric film formed over said second electrode, and a plurality of additional metallic electrodes formed in a same plane over said second polymeric film, each of said additional metallic electrodes being in field-applying relationship with a selected portion of said first polymeric film and each independently operative to superimpose electrical fields on said first electrical field so as to modulate said potential barrier and control electron conduction through the corresponding selected portion of said first polymeric film and between said first and said second electrodes.

7. A logical circuit device as defined in claim 6 wherein each of said plurality of means additional metallic electrodes is independently operative to apply a superimposed electrical field to modulate said potential barrier sufficiently to induce a predetermined magnitude of electron conduction through the corresponding selected portions of said first polymeric film and between said first and second electrodes.

8. A logical circuit device as defined in claim 6 wherein said plurality of additional metallic electrodes are operative concurrently to apply superimposed electrical fields to modulate said potential barrier sufficiently to induce a predetermined magnitude of electron conduction through said first polymeric film and between said first and second electrodes.

9. A logical circuit device comprising a first and a second metallic electrode, a first polymeric film prepared from said ethylenically unsaturated monomers and sandwiched between said first and said second electrodes, said first polymeric film exhibiting a total potential energy barrier to preclude substantial electron conduction in the absence of an applied electrical field of at least a predetermined magnitude in response to which electron conduction increases exponentially, said second electrode formed as a discontinuous planar structure, a plurality of third electrodes formed over said second electrode and electrically insulated therefrom by a second polymeric film, said third electrodes formed in particular patterns such that equal surface areas are exposed to said first electrode and said first polymeric film through said second electrode, first means for applying a potential between said first and said second electrodes so as to subject said first polymeric film to a first magnitude electrical field, second means for applying a potential between said first electrode and selected ones of said third electrodes so as to generate electrical fields superimposed on said first magnitude electrical field so as to modulate said potential energy barrier in said first polymeric film to control electron conduction therethrough and between said first and said second electrodes.

10. A logical circuit device as defined in claim 9 wherein said plurality of third electrodes are formed in a single plane, and means for insulating said second electrode and each of said third electrodes.

References Cited by the Examiner

UNITED STATES PATENTS

| | | | |
|---|---|---|---|
| 2,524,033 | 3/1950 | Bardeen | 179—170 |
| 3,121,177 | 11/1964 | Davis | 307—88.5 |

OTHER REFERENCES

"U.S.S.R. Claims Plastics Fibre Transistor," from "Electronics" (magazine), col. 33, No. 4, pp. 26. 27. Jan. 22. 1960.

JOHN W. HUCKERT, *Primary Examiner.*

R. SANDLER, *Assistant Examiner.*